United States Patent
Mandal

(10) Patent No.: US 7,012,030 B2
(45) Date of Patent: Mar. 14, 2006

(54) VERY LOW DIELECTRIC CONSTANT PLASMA-ENHANCED CVD FILMS

(75) Inventor: Robert P. Mandal, Saratoga, CA (US)

(73) Assignee: Applied Materials Inc., Santa Clara, CA (US)

( * ) Notice: Subject to any disclaimer, the term of this patent is extended or adjusted under 35 U.S.C. 154(b) by 0 days.

(21) Appl. No.: 10/882,780

(22) Filed: Jun. 30, 2004

(65) Prior Publication Data

US 2004/0235291 A1    Nov. 25, 2004

Related U.S. Application Data

(63) Continuation of application No. 10/404,830, filed on Apr. 1, 2003, which is a continuation of application No. 09/484,689, filed on Jan. 18, 2000, now Pat. No. 6,541,367.

(51) Int. Cl.
  H01L 21/31   (2006.01)
  H01L 21/469  (2006.01)

(52) U.S. Cl. ...................... 438/778; 438/789

(58) Field of Classification Search ................ 438/622, 438/623, 633, 778, 781, 787, 789, 790
  See application file for complete search history.

(56) References Cited

U.S. PATENT DOCUMENTS

| | | | |
|---|---|---|---|
| 4,610,859 A * | 9/1986 | Miyagawa et al. ......... 423/347 |
| 4,845,054 A | 7/1989 | Mitchener | |
| 5,028,566 A | 7/1991 | Lagendijk | |
| 5,314,724 A | 5/1994 | Tsukune et al. | |
| 5,420,132 A * | 5/1995 | Guillaumet et al. ... 514/253.11 |
| 5,508,234 A | 4/1996 | Dusablon, Sr. et al. | |
| 5,541,022 A * | 7/1996 | Mizumoto et al. .......... 429/333 |
| 5,638,251 A | 6/1997 | Goel et al. | |
| 5,776,990 A | 7/1998 | Hedrick et al. | |
| 5,849,644 A | 12/1998 | Schuegraf | |
| 5,918,146 A | 6/1999 | Yamashita | |
| 5,989,998 A | 11/1999 | Sugahara et al. | |

(Continued)

FOREIGN PATENT DOCUMENTS

EP   0 522 799 A2   1/1993

(Continued)

OTHER PUBLICATIONS

Kumar, "Dielectric Properties of Plasma Polymerized Furan Thin Film Capacitors" Material Letters, vol. 41 (1999) pp. 1-4.

(Continued)

Primary Examiner—Phuc T. Dang
(74) Attorney, Agent, or Firm—Patterson & Sheridan

(57) ABSTRACT

The present invention provides a method for depositing nano-porous low dielectric constant films by reacting an oxidizable silicon containing compound or mixture comprising an oxidizable silicon component and an oxidizable non-silicon component having thermally liable groups with nitrous oxide, oxygen, ozone, or other source of reactive oxygen in gas-phase plasma-enhanced reaction. The deposited silicon oxide based film is annealed to form dispersed microscopic voids that remain in a nano-porous silicon oxide based film having a low-density structure. The nano-porous silicon oxide based films are useful for forming layers between metal lines with or without liner or cap layers. The nano-porous silicon oxide based films may also be used as an intermetal dielectric layer for fabricating dual damascene structures. Preferred nano-porous silicon oxide based films are produced by reaction of methylsilyl-1,4-dioxinyl ether or methylsiloxanyl furan and 2,4,6-trisilaoxane or cyclo-1,3,5,7-tetrasilylene-2,6-dioxy-4,8 dimethylene with nitrous oxide or oxygen followed by a cure/anneal that includes a gradual increase in temperature.

20 Claims, 8 Drawing Sheets

U.S. PATENT DOCUMENTS

| | | | |
|---|---|---|---|
| 6,001,747 A | 12/1999 | Annapragada | |
| 6,051,321 A | 4/2000 | Lee et al. | |
| 6,054,379 A | 4/2000 | Yau et al. | |
| 6,072,227 A | 6/2000 | Yau et al. | |
| 6,127,285 A | 10/2000 | Nag | |
| 6,147,009 A | 11/2000 | Grill et al. | |
| 6,171,945 B1 | 1/2001 | Mandal et al. | |
| 6,238,751 B1 | 5/2001 | Mountsier | |
| 6,287,990 B1 | 9/2001 | Cheung et al. | |
| 6,303,523 B1 | 10/2001 | Cheung et al. | |
| 6,437,443 B1 | 8/2002 | Grill et al. | |
| 6,441,491 B1 | 8/2002 | Grill et al. | |
| 6,451,712 B1 | 9/2002 | Dalton et al. | |
| 6,455,445 B1 | 9/2002 | Matsuki | |
| 6,479,110 B1 | 11/2002 | Grill et al. | |
| 6,530,340 B1 | 3/2003 | You et al. | |
| 6,541,398 B1 | 4/2003 | Grill et al. | |
| 6,541,865 B1 | 4/2003 | Hawker et al. | |
| 6,583,048 B1 | 6/2003 | Vincent et al. | |
| 6,627,532 B1 * | 9/2003 | Gaillard et al. | 438/623 |
| 6,737,365 B1 | 5/2004 | Kloster et al. | |
| 6,756,323 B1 | 6/2004 | Grill et al. | |
| 6,768,200 B1 | 7/2004 | Grill et al. | |
| 6,770,573 B1 | 8/2004 | Grill et al. | |
| 6,790,789 B1 | 9/2004 | Grill et al. | |
| 6,825,130 B1 | 11/2004 | Todd | |
| 6,846,515 B1 | 1/2005 | Vrtis et al. | |
| 2002/0034625 A1 | 3/2002 | Grill et al. | |
| 2002/0037442 A1 | 3/2002 | Grill et al. | |
| 2002/0137359 A1 | 9/2002 | Grill et al. | |
| 2002/0180051 A1 | 12/2002 | Grill et al. | |
| 2003/0057414 A1 | 3/2003 | Dalton et al. | |
| 2003/0064154 A1 | 4/2003 | Laxman et al. | |
| 2003/0104689 A1 | 6/2003 | Shioya et al. | |
| 2003/0111712 A1 | 6/2003 | Andideh et al. | |
| 2003/0143865 A1 | 7/2003 | Grill et al. | |
| 2003/0198742 A1 | 10/2003 | Vrtis et al. | |
| 2004/0048960 A1 | 3/2004 | Peterson et al. | |
| 2004/0096593 A1 | 5/2004 | Lukas et al. | |
| 2004/0096672 A1 | 5/2004 | Lukas et al. | |
| 2004/0101632 A1 | 5/2004 | Zhu et al. | |
| 2004/0102006 A1 | 5/2004 | Xu et al. | |
| 2004/0115954 A1 | 6/2004 | Todd | |

FOREIGN PATENT DOCUMENTS

| | | |
|---|---|---|
| EP | 0 528 540 A2 | 2/1993 |
| EP | 0 703 611 A1 | 3/1996 |
| EP | 0 935 283 A2 | 8/1999 |
| WO | WO 99/15711 A1 | 4/1999 |
| WO | WO 99/41423 A2 | 8/1999 |
| WO | WO 02/43119 A2 | 5/2002 |

OTHER PUBLICATIONS

European Search Report for EP 00 12 6111.4-1235, dated Sep. 24, 2004. (AMAT/3771.EP).

Australian Search Report fo SG 200006722-3, dated Nov. 1, 2002. (AMAT/3771.SG).

\* cited by examiner

VERY LOW DIELECTRIC CONSTANT PLASMA-ENHANCED CVD FILMS

CROSS-REFERENCE TO RELATED APPLICATIONS

The present application is a continuation of U.S. patent application Ser. No. 10/404,830, filed Apr. 1, 2003, which is a continuation of U.S. patent application Ser. No. 09/484,689, filed Jan. 18, 2000, now issued as U.S. Pat. No. 6,541,367.

BACKGROUND OF THE INVENTION

1. Field of the Invention

The present invention relates to the fabrication of integrated circuits. More particularly, the invention relates to a process for depositing dielectric layers on a substrate.

2. Background of the Invention

One of the primary steps in the fabrication of modern semiconductor devices is the formation of metal and dielectric films on a substrate by chemical reaction of gases. Such deposition processes are referred to as chemical vapor deposition or CVD. Conventional thermal CVD processes supply reactive gases to the substrate surface where heat-induced chemical reactions take place to produce a desired film. The high temperatures at which some thermal CVD processes operate can damage device structures having layers previously formed on the substrate. A preferred method of depositing metal and dielectric films at relatively low temperatures is plasma-enhanced CVD (PECVD) techniques such as described in U.S. Pat. No. 5,362,526, entitled "Plasma-Enhanced CVD Process Using TEOS for Depositing Silicon Oxide", which is incorporated by reference herein. Plasma-enhanced CVD techniques promote excitation and/or disassociation of the reactant gases by the application of radio frequency (RF) energy to a reaction zone near the substrate surface, thereby creating a plasma of highly reactive species. The high reactivity of the released species reduces the energy required for a chemical reaction to take place, and thus lowers the required temperature for such PECVD processes.

Semiconductor device geometries have dramatically decreased in size since such devices were first introduced several decades ago. Since then, integrated circuits have generally followed the two year/half-size rule (often called Moore's Law), which means that the number of devices that will fit on a chip doubles every two years. Today's fabrication plants are routinely producing devices having 0.35 $\mu$m and even 0.25 $\mu$m feature sizes, and tomorrow's plants soon will be producing devices having even smaller geometries.

In order to further reduce the size of devices on integrated circuits, it has become necessary to use conductive materials having low resistivity and insulators having low k (dielectric constant<2.5) to reduce the capacitive coupling between adjacent metal lines. Liner/barrier layers have been used between the conductive materials and the insulators to prevent diffusion of byproducts such as moisture onto the conductive material as described in International Publication Number WO 99/41423, published on Aug. 17, 1999. For example, moisture that can be generated during formation of a low k insulator readily diffuses to the surface of the conductive metal and increases the resistivity of the conductive metal surface. A barrier/liner layer formed from organosilicon or organosilane nitride materials can block the diffusion of the byproducts. However, the barrier/liner layers typically have dielectric constants that are greater than about 2.5, and the high dielectric constants result in a combined insulator that may not significantly reduce the dielectric constant.

FIG. 1A-1E illustrates a three-layer deposition PECVD process for depositing a PECVD lining layer 2 of the oxidized organosilane or organosiloxane polymer as described in International Publication Number WO 99/41423. The lining layer 2 acts as an isolation layer between a subsequent layer 7 and the underlying substrate surface 6 and metal lines 8, 9, 10 formed on the substrate surface. The layer 7 is capped by a PECVD capping layer 12 of the oxidized organosilane or organosiloxane polymer. The PECVD process deposits a multi-component dielectric layer, wherein an carbon containing silicon dioxide ($SiO_2$) is first deposited on the patterned metal layer having metal lines 8, 9, 10 formed on substrate 6.

Referring to FIG. 1A, the PECVD lining layer 2 is deposited by the plasma enhanced reaction of an organosilane or organosiloxane compound such as methylsilane, $CH_3SiH_3$, and an oxidizing gas such as $N_2O$ in the presence of an inert gas, such as argon, at a temperature of approximately −20° C. to 40° C. The oxidized organosilane or organosiloxane layer is then cured. The deposited PECVD lining layer 2 (at about 2000 Å per minute) has improved barrier characteristics for the subsequent deposition of the layer 7 shown in FIG. 1B. The lining layer obtained from methylsilane has sufficient C—H bonds to be hydrophobic, and is an excellent moisture barrier. A low K dielectric layer 7 is then deposited on the liner layer 2 by the reaction of a silane compound and hydrogen peroxide ($H_2O_2$) at a temperature below 200° C. at a pressure of about 0.2 to about 5 Torr during deposition of the layer 7. The layer 7 may be partially cured as shown in FIG. 1C to remove solvents such as water prior to deposition of a cap layer 12 as shown in FIG. 1D. Curing is performed by pumping down a reaction under an inert gas atmosphere under 10 Torr.

Conventional liner layers, such as silicon nitride (SiN), have higher dielectric constants than silicon oxides, and the combination of low k dielectric layers with high k dielectric liner layers provides little or no improvement in the overall stack dielectric constant and capacitive coupling. Referring to FIG. 1D, after deposition of the layer 7, an optional capping layer 12 may be deposited on the low k dielectric layer 7 by the plasma enhanced reaction of an organosilane or organosiloxane compound and an oxidizing gas such as $N_2O$. Referring to FIG. 1E, after deposition of the capping layer, if any, the deposited layers are cured in a furnace or another chamber to drive off remaining solvent or water. The capping layer 12 is also an oxidized organosilane or organosiloxane film that has good barrier properties and has a dielectric property of about 3.0. Both the liner layer 2 and the cap layer 12 have a dielectric constant greater than 3.0 and the high dielectric constant layers substantially detract from the benefit of the low k dielectric layer 7.

As devices get smaller, liner layers and cap layers having relatively high dielectric constants contribute more to the overall dielectric constant of a multi-component dielectric layer. Additionally, the smaller device geometries result in an increase in parasitic capacitance between devices. Parasitic capacitance between metal interconnects on the same or adjacent layers in the circuit can result in crosstalk between the metal lines or interconnects and/or resistance-capacitance (RC) delay, thereby reducing the response time of the device and degrading the overall performance of the device. The effects of parasitic capacitance between metal interconnects on the same or adjacent layers in the circuit is especially of concern as the current state of the art circuits can employ 4 to 5 levels of interconnection, while next generation devices may require 6, 7, or possibly 8 levels of interconnection.

Lowering the parasitic capacitance between metal interconnects separated by dielectric material can be accomplished by either increasing the thickness of the dielectric material or by lowering the dielectric constant of the dielectric material. Increasing the thickness of the dielectric materials, however, does not address parasitic capacitance within the same metallized layer or plane. As a result, to reduce the parasitic capacitance between metal interconnects on the same or adjacent layers, one must change the material used between the metal lines or interconnects to a material having a lower dielectric constant than that of the materials currently used, i.e., $k \approx 3.0$.

Therefore, there remains a need for dielectric layers having dielectric constants below about 2.5 with good adhesion properties.

SUMMARY OF THE INVENTION

The present invention provides a method for depositing a nano-porous silicon oxide layer having a low dielectric constant. The nano-porous silicon oxide layer is produced by depositing a silicon/oxygen containing material that further contains thermally labile organic groups, and by controlled annealing of the deposited silicon/oxygen containing material to form microscopic gas pockets, or voids, that are uniformly dispersed in a silicon oxide layer. The relative volume of the microscopic gas pockets to the silicon oxide layer is controlled to preferably maintain a closed cell foam structure that provides low dielectric constants. The silicon/oxygen material is deposited by plasma enhanced chemical vapor deposition of one or more compounds comprising at least one oxidizable silicon containing component and at least one non-silicon containing component having thermally labile groups. The labile groups in the reactive compound or mixture contain sufficient oxygen to convert to gaseous products to evolve from the film and leave voids when the deposited silicon oxide layer is annealed.

The oxidizable silicon containing component can be separated from non-silicon components having thermally labile groups in the same molecule. Preferred silicon-oxygen ligands of components that form nano-porous silicon oxide-based layers under controlled annealing comprise methylsiloxy ($CH_3$—$SiH_2$—O—) or dimethylsiloxy (($CH_3$)$_2$—SiH—O—) groups. Preferred, non-silicon containing components that form compounds with the silicon components are multiply unsaturated cycloalkene components including dioxinyl (—(—CH=CH—O—CH=CH—O—)—), furyl (—(—CH=CH—CH=CH—O—)—), fulvenyl (—(—CH=CH—CH=CH—C($CH_2$)—)—), or fluorinated carbon derivative groups thereof. Preferred compounds formed from these components include methylsilyl-1,4-dioxinyl ether or methylsiloxanyl furan. Formation of voids using 2,4,6-trisilaoxane and cyclo-1,3,5,7-tetrasilano-2,6-dioxy-4,8-dimethylene is enhanced by virtue of their non-planar ring structure.

Such compounds react with an oxidizing gas to form a silicon/oxygen containing material that retains many of the labile organic groups at temperatures below about 50° C. The amount of labile groups can be increased by mixing the reactive compounds with non-silicon containing components that comprise one or more labile groups, such as vinyl-1,4-dioxinyl ether, vinyl furyl ether, vinyl-1,4-dioxin, vinyl furan, methyl furoate, furyl formate, furyl acetate, furaldehyde, difuryl ketone, difuryl ether, difurfuryl ether, furan, 1,4-dioxin, fluorinated derivatives thereof, and combinations thereof. The non-silicon containing components can alternatively be mixed with the reactive silicon containing materials that do not contain thermally labile organic groups, such as methylsilane, dimethylsilane, 1,1,3,3-tetramethyldisiloxane, 1,1,5,5-tetramethyltrisiloxane, disilanomethane, and fluorinated carbon derivatives thereof.

The silicon/oxygen containing material is preferably deposited by striking a plasma at an RF power level from 10–250 W in an oxidizing gas selected from the group consisting of $N_2O$, $O_2$, $O_3$, $CO_2$, and combinations thereof. The deposited silicon/oxygen containing material is then annealed at a gradually increasing temperature profile to convert the labile organic groups to dispersed gas pockets in a nano-porous silicon oxide layer having a low dielectric constant attributed to a preferably closed cell foam structure. Annealing preferably increases the temperature of the deposited material to about 350° C. to about 400° C.

In a preferred embodiment, the nano-porous silicon oxide layer of the present invention is deposited on a PECVD silicon oxide, silicon nitride, silicon oxynitride, or hydrogenated silicon carbide barrier layer that was deposited on a patterned metal layer by plasma assisted reaction of one or more reactive silicon containing compounds. The nano-porous silicon oxide layer is then deposited in the same chamber or in an adjacent cluster tool processing chamber. After annealing as described above, the nano-porous silicon oxide layer is capped in the same chamber or in an adjacent cluster tool processing chamber with PECVD silicon oxide, silicon nitride, silicon oxynitride, or hydrogenated silicon carbide. The liner and cap layers serve as barriers which protect the nano-porous silicon oxide layer.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

FIG. 5 is a flow chart illustrating steps undertaken in depositing liner and cap layers in a deposition process according to one embodiment of the present invention;

Figure 1A:
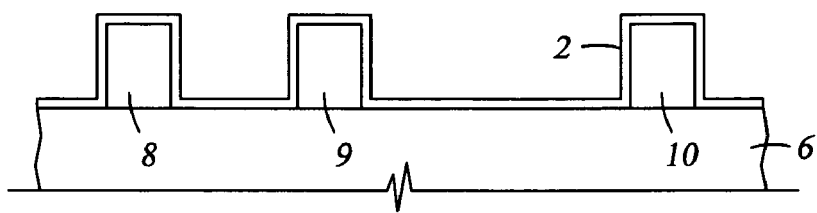
FIG. 1A-1E (Prior Art) are schematic diagrams of dielectric layers deposited on a substrate by the processes known in the art.
Figure 1B:
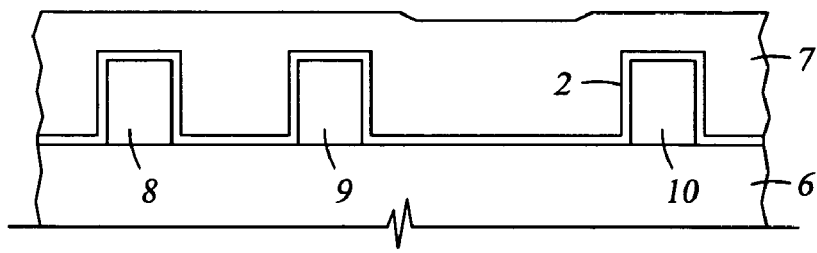
Figure 1C:
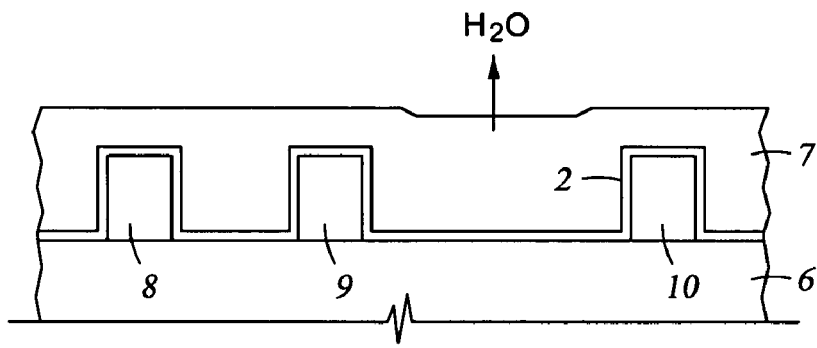
Figure 1D:
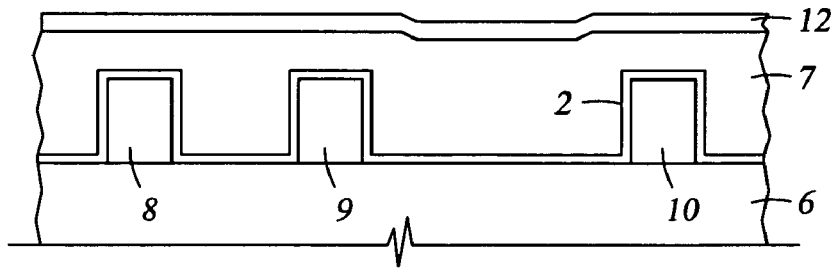
Figure 1E:
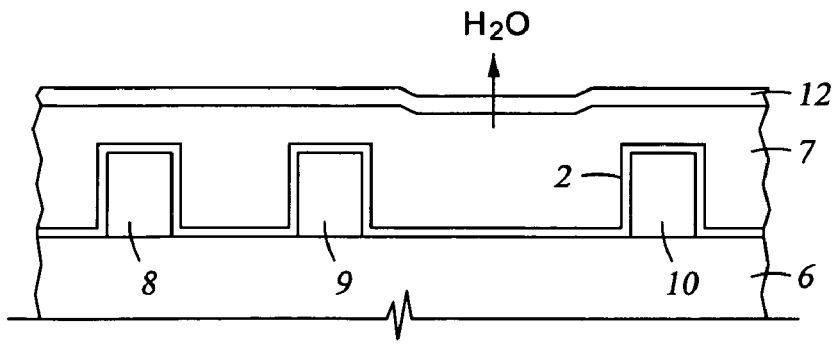

For a further understanding of the present invention, reference should be made to the ensuing detailed description.

DESCRIPTION OF A PREFERRED EMBODIMENT

The present invention provides a method for depositing a nano-porous silicon oxide layer having a low dielectric constant. The nano-porous silicon oxide layer is produced by plasma enhanced (PECVD) or microwave enhanced chemical vapor deposition of a silicon/oxygen containing material that optionally contains thermally labile organic groups, and by controlled annealing of the deposited silicon/oxygen containing material to form microscopic gas pockets that are uniformly dispersed in a silicon oxide layer. The relative volume of the microscopic gas pockets to the silicon oxide layer is controlled to preferably maintain a closed cell foam structure that provides low dielectric constants after annealing. The nano-porous silicon oxide layers will have dielectric constants less than about 2.5, preferably less than about 2.0.

The silicon/oxygen material is chemical vapor deposited by reacting an oxidizable silicon containing compound or mixture comprising an oxidizable silicon component and an unsaturated non-silicon bearing component having thermally labile groups with an oxidizing gas. The oxidizing gases are oxygen ($O_2$) or oxygen containing compounds such as nitrous oxide ($N_2O$), ozone ($O_3$), and carbon dioxide ($CO_2$), preferably $N_2O$ or $O_2$.

Oxygen and oxygen containing compounds are preferably dissociated to increase reactivity when necessary to achieve a desired carbon content in the deposited film. RF power can be coupled to the deposition chamber to increase dissociation of the oxidizing compounds. The oxidizing compounds may also be dissociated in a microwave chamber prior to entering the deposition chamber to reduce excessive dissociation of the silicon containing compounds. Deposition of the silicon oxide layer can be continuous or discontinuous. Although deposition preferably occurs in a single deposition chamber, the layer can be deposited sequentially in two or more deposition chambers. Furthermore, RF power can be cycled or pulsed to reduce heating of the substrate and promote greater porosity in the deposited film.

The oxidizable silicon component of the oxidizable silicon containing compound or mixture comprises organosilane or organosiloxane compounds which generally include the structure:

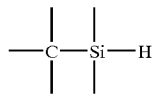

wherein each Si is bonded to at least one hydrogen atom and may be bonded to one or two carbon atoms, and C is included in an organo group, preferably alkyl or alkenyl groups such as —$CH_3$, —$CH_2$—$CH_3$, —$CH_2$—, or —$CH_2$—$CH_2$—, or fluorinated carbon derivatives thereof. When an organosilane or organosiloxane compound includes two or more Si atoms, each Si is separated from another Si by —O—, —C—, or —C—C—, wherein each bridging C is included in an organo group, preferably alkyl or alkenyl groups such as —$CH_2$—, —$CH_2$—$CH_2$—, —CH($CH_3$)—, —C($CH_3$)$_2$—, or fluorinated carbon derivatives thereof. The preferred organosilane and organosiloxane compounds are gases or liquids near room temperature and can be volatilized above about 10 Torr. Suitable silicon containing compounds include:

| | |
|---|---|
| methylsilane, | $CH_3$—$SiH_3$ |
| dimethylsilane, | $(CH_3)_2$—$SiH_2$ |
| disilanomethane, | $SiH_3$—$CH_2$—$SiH_3$ |
| bis(methylsilano)methane, | $CH_3$—$SiH_2$—$CH_2$—$SiH_2$—$CH_3$ |
| 2,4,6-trisilaoxane | —(—$SiH_2$—$CH_2$—$SiH_2$—$CH_2$—$SiH_2$—O—)— (cyclic) |
| cyclo-1,3,5,7-tetrasilano-2,6-dioxy-4,8-dimethylene | —(—$SiH_2$—$CH_2$—$SiH_2$—O—)$_2$— (cyclic) |
| 1,3,5-trisilacyclohexane, | —(—$SiH_2$—$CH_2$—)$_3$— (cyclic) |
| 1,3-dimethyldisiloxane, | $CH_3$—$SiH_2$—O—$SiH_2$—$CH_3$ |
| 1,1,3,3-tetramethyldisiloxane | $(CH_3)_2$—SiH—O—SiH—$(CH_3)_2$ |
| 1,1,5,5-tetramethyltrisiloxane, and | $(CH_3)_2$—SiH—O—$SiH_2$—O—SiH—$(CH_3)_2$ |
| 1,1,3,5,5-pentamethyltrisiloxane | $(CH_3)_2$—SiH—O—SiH($CH_3$)—O—SiH—$(CH_3)_2$ | and fluorinated carbon derivatives thereof, such as 1,2-disilanotetrafluoroethane. The hydrocarbon groups in the organosilanes and organosiloxane may be partially or fully fluorinated to convert C—H bonds to C—F bonds. Many of the preferred organosilane and organosiloxane compounds are commercially available. A combination of two or more of the organosilanes or organosiloxanes can be employed to provide a blend of desired properties such as dielectric constant, oxide content, hydrophobicity, film stress, and plasma etching characteristics.

When the oxidizable silicon component forms a compound with an unsaturated non-silicon bearing component having thermally labile groups, the organosilane or organosiloxane compound are functional groups possessing both a silicon oxygen bond and a silicon-hydrogen bond. Preferred functional groups having the bonding requirements include:

| | |
|---|---|
| methylsiloxy, and | ($CH_3$—$SiH_2$—O—) |
| dimethylsiloxy | (($CH_3$)$_2$—SiH—O—). |

The unsaturated non-silicon bearing component having thermally labile groups has the property of reacting with a plasma-sustained oxidizing environment to form thermally labile molecules that deposit, and which, when subsequently exposed to elevated temperatures, thermally decompose to form volatile species with low boiling points. Decomposition and evolution of the thermally labile group's volatile species from the deposited film will leave voids in the structure, reducing the structure's density. Selectively removing embedded chemically reacted solid material within the deposited film by a thermal process results in low density films which have low dielectric constants. Formation of voids using some compounds such as 2,4,6-trisilaoxane (2,4,6-trisilatetrahydropyran) and cyclo-1,3,5,7-tetrasilano- 2,6-dioxy-4,8-dimethylene is achieved during annealing without addition of labile groups by virtue of a non-planar ring structure:

| | |
|---|---|
| 1,3,5,7-tetrasilano-2,6-dioxy-4,8-dimethylene, and | —(—SiH$_2$—CH$_2$—SiH$_2$—O—)$_2$— (cyclic) |
| 2,4,6-trisilatetrahydropyran, | —SiH$_2$—CH$_2$—SiH$_2$—CH$_2$—SiH$_2$—O— (cyclic). |

The thermally labile organic groups contain sufficient oxygen to form gaseous products when the silicon oxide layer is annealed.

When the oxidizable silicon component forms a compound with an unsaturated non-silicon bearing component having thermally labile groups, preferred thermally labile groups are non-silicon containing multiply unsaturated cycloalkanes (having two or more carbon-carbon double bonds), including heterocyclodialkenes, with oxygen or nitrogen incorporated within the molecular structure, and which generally tend to perform favorably in plasma environments. Preferred labile groups include:

| | |
|---|---|
| Dioxin, C$_4$H$_4$O$_2$, | —(—CH=CH—O—CH=CH—O—)—, cyclic |
| Furan, C$_4$H$_4$O, | —(—CH=CH—CH=CH—O—)—, cyclic |
| Fulvene, C$_6$H$_6$, | —(—CH=CH—CH=CH—C(CH$_2$)—)—, cyclic. |

Oxidizable silicon containing compounds comprising the oxidizable silicon component and the thermally labile groups include:

and fluorinated carbon derivatives thereof. Preferably the compounds are liquid at room temperature and can be volatilized near a pressure of 10 Torr or above. Such compounds react with an oxidizing gas to form a gel-like silicon/oxygen containing material that retains many of the labile organic groups at temperatures below about 50° C.

The amount of labile organic groups retained in the deposited silicon/oxygen containing material can be increased by mixing the reactive compounds with non-silicon containing components that comprise one or more labile organic groups. The labile organic groups include the dioxan, furan, and fulvene derivative chemicals described for the silicon containing reactive compounds and other oxygen containing organic groups. The labile organic groups are preferably the silicon containing and non-silicon containing components incorporated in the same molecule, but with the methylsilyl or methylsiloxanyl groups replaced with vinyl groups, or with the methylsiloxanyl groups replaced with ester groups, or with the methylsiloxanyl groups replaced with other non-silicon containing organic groups, in addition to those chemicals without the methylsiloxanyl groups, such as 1,4-dioxin and furan. Preferred non-silicon containing multiply unsaturated cycloalkanes (having two or more carbon-carbon double bonds) include:

| | |
|---|---|
| vinyl-1,4-dioxinyl ether | CH$_2$=CH—O—(C$_4$H$_3$O$_2$), cyclic |
| vinyl furyl ether | CH$_2$=CH—O—(C$_4$H$_3$O), cyclic |
| vinyl-1,4-dioxin | CH$_2$=CH—(C$_4$H$_3$O$_2$), cyclic |
| vinyl furan | CH$_2$=CH—O—(C$_4$H$_3$O), cyclic |
| methyl furoate | CH$_3$C(O)—O—(C$_4$H$_3$O), cyclic |
| furyl formate | (C$_4$H$_3$O)—COOH, cyclic |

| | |
|---|---|
| methylsilyl-1,4-dioxinyl ether | CH$_3$—SiH$_2$—O—(C$_4$H$_3$O$_2$) |
| 2-methylsiloxanyl furan | —(—CH=CH—CH=C(O—SiH$_2$—CH$_3$)—O—)—, cyclic |
| 3-methylsiloxanyl furan | —(—CH=CH—C(O—SiH$_2$—CH$_3$)=CH—O—)—, cyclic |
| 2,5-bis(methylsiloxy)-1,4-dioxin | —(—CH=C(O—SiH$_2$—CH$_3$)—O—CH=C(O—SiH$_2$—CH$_3$)—O—)—, cyclic |
| 3,4-bis(methylsiloxanyl) furan | —(—CH=C(O—SiH$_2$—CH$_3$)—C(O—SiH$_2$—CH$_3$)=CH—O—)—, cyclic |
| 2,3-bis(methylsiloxanyl) furan | —(—CH=CH—C(O—SiH$_2$—CH$_3$)=C(O—SiH$_2$—CH$_3$)—O—)—, cyclic |
| 2,4-bis(methylsiloxanyl) furan | —(—CH=C(O—SiH$_2$—CH$_3$)—CH=C(O—SiH$_2$—CH$_3$)—O—)—, cyclic |
| 2,5-bis(methylsiloxanyl) furan | —(—C(O—SiH$_2$—CH$_3$)=CH—CH=C(O—SiH$_2$—CH$_3$)—O—)—, cyclic |
| 1-methylsiloxanylfulvene | —(—CH=CH—CH=CH—C(CH(O—SiH$_2$—CH$_3$))—)—, cyclic |
| 2-methylsiloxanylfulvene | —(—CH=CH—CH=CH—C(CH$_2$)(O—SiH$_2$—CH$_3$)—)—, cyclic |
| 6-methylsiloxanylfulvene | —(—C(O—SiH$_2$—CH$_3$)=CH—CH=CH—C=CH—)—, cyclic |
| bis(methylsiloxanyl)fulvene | (C$_6$H$_4$)(O—SiH$_2$—CH$_3$)$_2$, cyclic |
| dimethylsilyl-1,4-dioxinyl ether | (CH$_3$)$_2$—SiH—O—(C$_4$H$_3$O$_2$), cyclic |
| 2-dimethylsiloxanyl furan | —(—CH=CH—CH=C(O—SiH—(CH$_3$)$_2$)—O—)—, cyclic |
| 3-dimethylsiloxanyl furan | —(—CH=CH—C(O—SiH—(CH$_3$)$_2$)=CH—O—)—, cyclic |
| 2,5-bis(dimethylsiloxy)-1,4-dioxin | —(—CH=C(O—SiH—(CH$_3$)$_2$)—O—CH=C(O—SiH—(CH$_3$)$_2$)—O—)—, cyclic |
| 3,4-bis(dimethylsiloxanyl) furan | —(—CH=C(O—SiH—(CH$_3$)$_2$)—C(O—SiH—(CH$_3$)$_2$)=CH—O—)— cyclic |
| 2,3-bis(dimethylsiloxanyl) furan | —(—CH=CH—C(O—SiH—(CH$_3$)$_2$)=C(O—SiH—(CH$_3$)$_2$)—O—)— cyclic |
| 2,4-bis(dimethylsiloxanyl) furan | —(—CH=C(O—SiH—(CH$_3$)$_2$)—CH=C(O—SiH—(CH$_3$)$_2$)—O—)— cyclic |
| 2,5-bis(dimethylsiloxanyl) furan | —(—C(O—SiH—(CH$_3$)$_2$)=CH—CH=C(O—SiH—(CH$_3$)$_2$)—O—)— cyclic |
| 1-dimethylsiloxanylfulvene | —(—CH=CH—CH=CH—C(CH(O—SiH—(CH$_3$)$_2$))—)—, cyclic |
| 2-dimethylsiloxanylfulvene | —(—CH=CH—CH=CH—C(CH$_2$)(O—SiH—(CH$_3$)$_2$)—)—, cyclic |
| 6-dimethylsiloxanylfulvene | —(—C(O—SiH—(CH$_3$)$_2$)=CH—CH=CH—C=CH—)—, cyclic |
| bis(dimethylsiloxanyl)fulvene | (C$_6$H$_4$)(O—SiH—(CH$_3$)$_2$)$_2$, cyclic |

-continued

| | |
|---|---|
| furyl acetate | (C₄H₃O)—CH₂COOH, cyclic |
| furaldehyde | CH(O)—(C₄H₃O), cyclic |
| difuryl ketone | (C₄H₃O)₂C(O), cyclic |
| difuryl ether | (C₄H₃O)—O—(C₄H₃O), cyclic |
| difurfuryl ether | (C₄H₃O)—CH₂—O—CH₂—(C₄H₃O), cyclic |
| furan, | C₄H₄O, (cyclic) |
| 1,4-dioxin, | C₄H₄O₂, (cyclic) | and fluorinated carbon derivatives thereof.

The non-silicon containing components can alternatively be mixed with the reactive silicon containing materials that do not contain labile organic groups, such as:

| | |
|---|---|
| methylsilane, | CH₃—SiH₃ |
| dimethylsilane, | (CH₃)₂—SiH₂ |
| disilanomethane, | SiH₃—CH₂—SiH₃ |
| bis(methylsilano)methane, | CH₃—SiH₂—CH₂—SiH₂—CH₃ |
| 2,4,6-trisilaoxane | —(—SiH₂—CH₂—SiH₂—CH₂—SiH₂—O—)— (cyclic) |
| 1,3,5-trisilacyclohexane, | —(—SiH₂CH₂—)₃ — (cyclic) |
| cyclo-1,3,5,7-tetrasilano-2,6-dioxy-4,8-dimethylene | (—SiH₂—CH₂—SiH₂—O—)₂— (cyclic) |
| 1,3-dimethyldisiloxane, | CH₃—SiH₂—O—SiH₂—CH₃ |
| 1,1,3,3-tetramethyldisiloxane | (CH₃)₂—SiH—O—SiH—(CH₃)₂ |
| 1,1,5,5-tetramethyltrisiloxane, and | (CH₃)₂—SiH—O—SiH₂—O—SiH—(CH₃)₂ |
| 1,1,3,5,5-pentamethyltrisiloxane | (CH₃)₂—SiH—O—SiH(CH₃)—O—SiH—(CH₃)₂ | and the fluorinated carbon derivatives thereof.

A combination of thermally-labile-imparting and non-thermally-labile-imparting compounds can be co-deposited to tailor film properties. A preferred embodiment of the co-deposition compounds include a thermally-labile-imparting compound selected from either methylsilyl-1,4-dioxinyl ether or 2-methylsiloxanyl furan and a non-thermally-labile-imparting compound selected from either 2,4,6-trisilaoxane (2,4,6-trisilatetrahydropyran) or cyclo-1,3,5,7-tetrasilano-2,6-dioxy-4,8-dimethylene.

The co-deposited heteroalicyclic non-thermally-labile imparting molecules which can be used advantageously are non-planar cyclic molecules with insignificant ring strain and which deposit in random orientations. For 2,4,6-trisilaoxane and cyclo-1,3,5,7-tetrasilano-2,6-dioxy-4,8-dimethylene, the dual bonding of the silyl functional groups to the methylene groups can provide improved thermal stability and better mechanical properties of the resultant film. The non-planar molecule can provide a relatively reduced stack density within the deposited film, thereby producing low dielectric films.

After the silicon/oxygen containing material is deposited as a film, the film is preferably annealed at a gradually increasing temperature to convert the labile organic groups to dispersed gas pockets in a nano-porous silicon oxide layer having a low dielectric constant attributed to a preferably closed cell foam structure.

In a preferred embodiment, the nano-porous silicon oxide layer of the present invention is deposited on a PECVD silicon oxide, silicon nitride, silicon oxynitride, or hydrogenated silicon carbide (e.g., BLOk™ layer material available from Applied Materials Inc., of Santa Clara, Calif.) barrier layer that was deposited on a patterned metal layer by plasma assisted reaction of one or more reactive silicon containing compounds. The nano-porous silicon oxide layer is then deposited in the same multichamber clustered CVD system while applying RF power or remote microwave power, and is subsequently heated using an increasing temperature profile, optionally to between about 350° C. to about 400° C. The nano-porous silicon oxide layer is optionally capped in the same chamber or in an adjacent cluster tool processing chamber used to deposit the barrier layer, for example with a hydrogenated silicon carbide (BLOk™). The liner and cap layers serve as barriers which protect the nano-porous silicon oxide layer.

Treatment of the porous silicon oxide layer with a hydrophobic-imparting chemical during or following curing at an elevated temperature, improves the moisture resistance of the deposited film. The chemical used is preferably selected from a group consisting of hexamethyldisilazane, trimethylsilyldiethylamine, phenyldimethylsilyldimethylamine, trimethoxysilyldimethylamine, tris(trifluoromethyl)silyldimethylamine, bis(trimethyl-silyl)hydrazine, 1-phenyldimethylsilyl-2-methyl-hydrazine, 1-trimethoxysilyl-2-methyl-hydrazine, 1-tris(trifluoromethylsilyl)-2-methyl-hydrazine, trimethylchlorosilane, trimethylbromosilane, trimethylsilane, or combinations thereof.

The liner and cap layers can be deposited by plasma assisted chemical vapor deposition (CVD) of silicon oxide, silicon nitride, silicon oxynitride, or hydrogenated silicon carbide (BLOk™).

Further description of the invention will be directed toward a specific apparatus for depositing nano-porous silicon oxide layers of the present invention.

Exemplary CVD Plasma Reactor

Figure 2:
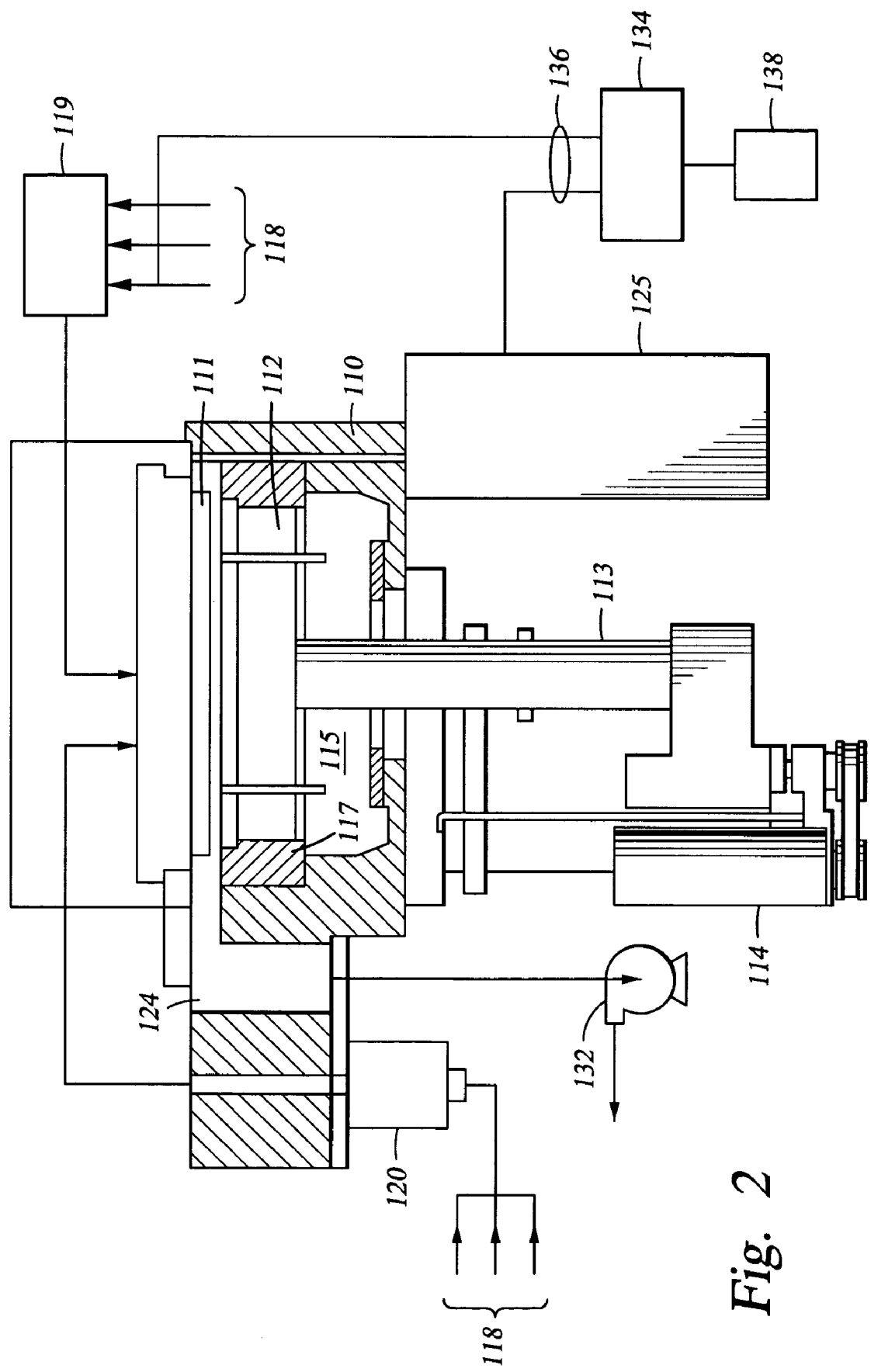
FIG. 2 is a cross-sectional diagram of an exemplary CVD reactor configured for use according to the present invention.

One suitable CVD plasma reactor in which a method of the present invention can be carried out is the "DLK" chamber available from Applied Materials of Santa Clara, Calif., and is shown in FIG. 2, which is a vertical, cross-section view of a parallel plate chemical vapor deposition reactor 110 having a high vacuum region 115. Reactor 110 contains a gas distribution manifold 111 for dispersing process gases through perforated holes in the manifold to a substrate or substrate (not shown) that rests on a substrate support plate or susceptor 112 which is raised or lowered by a lift motor 114. A liquid injection system (not shown), such as typically used for liquid injection of TEOS, may also be provided for injecting a liquid reactant. Preferred liquid injection systems include the AMAT Gas Precision Liquid Injection System (GPLIS) and the AMAT Extended Precision Liquid Injection System (EPLIS), both available from Applied Materials, Inc.

The reactor 110 includes heating of the process gases and substrate, such as by resistive heating coils (not shown) or external lamps (not shown). Referring to FIG. 2, susceptor 112 is mounted on a support stem 113 so that susceptor 112 (and the substrate supported on the upper surface of susceptor 112) can be controllably moved between a lower loading/off-loading position and an upper processing position which is closely adjacent to manifold 111.

When susceptor 112 and the substrate are in processing position, they are surrounded by an insulator 117 and process gases exhaust into a manifold 124. During processing, gases inlet to manifold 111 are uniformly distributed radially across the surface of the substrate. A vacuum pump 132 having a throttle valve controls the exhaust rate of gases from the chamber.

Before reaching manifold 111, deposition and carrier gases are input through gas lines 118 into a mixing system 119 where they are combined and then sent to manifold 111. An optional microwave system 150 (shown in FIG. 3)

having a applicator tube 120 may be located on the input gas line for the oxidizing gas to provide additional energy that dissociates only the oxidizing gas prior to entry to the reactor 110. The microwave applicator provides a power from between about 0 and about 6000 W. Generally, the process gases supply lines 18 for each of the process gases include (i) safety shut-off valves (not shown) that can be used to automatically or manually shut off the flow of process gas into the chamber, and (ii) mass flow controllers (also not shown) that measure the flow of gas through the gas supply lines. When toxic gases are used in the process, several safety shut-off valves are positioned on each gas supply line in conventional configurations.

The deposition process performed in reactor 110 can be either a non-plasma process on a cooled substrate pedestal or a plasma enhanced process. In a plasma process, a controlled plasma is typically formed adjacent to the substrate by RF energy applied to distribution manifold 111 from RF power supply 125 (with susceptor 112 grounded). Alternatively, RF power can be provided to the susceptor 112 or RF power can be provided to different components at different frequencies. RF power supply 125 can supply either single or mixed frequency RF power to enhance the decomposition of reactive species introduced into the high vacuum region 115. A mixed frequency RF power supply typically supplies power at a high RF frequency (RF1) of about 13.56 MHz to the distribution manifold 111 and at a low RF frequency (RF2) of about 360 KHz to the susceptor 112. The silicon oxide layers of the present invention are most preferably produced using low levels or pulsed levels of high frequency RF power. Pulsed RF power preferably provides 13.56 MHz RF power at about 20 to about 200 W during about 10% to about 30% of the duty cycle. Non-pulsed RF power preferably provides 13.56 MHz RF power at about 10 to about 150 W as described in more detail below. Low power deposition preferably occurs at a temperature range from about −20 to about 40° C. At the preferred temperature range, the deposited film is partially polymerized during deposition and polymerization is completed during subsequent curing of the film.

When additional dissociation of the oxidizing gas is desired, an optional microwave chamber can be used to input from about 0 to about 3000W of microwave power to the oxidizing gas prior to entering the deposition chamber. Separate addition of microwave power would avoid excessive dissociation of the silicon compounds prior to reaction with the oxidizing gas. A gas distribution plate having separate passages for the silicon compound and the oxidizing gas is preferred when microwave power is added to the oxidizing gas.

Typically, any or all of the chamber lining, gas inlet manifold faceplate, support stem 113, and various other reactor hardware is made out of material such as aluminum or anodized aluminum. An example of such a CVD reactor is described in U.S. Pat. No. 5,000,113, entitled "Thermal CVD/PECVD Reactor and Use for Thermal Chemical Vapor Deposition of Silicon Dioxide and In-situ Multi-step Planarized Process," issued to Wang et al. and assigned to Applied Materials, Inc., the assignee of the present invention.

The lift motor 114 raises and lowers susceptor 112 between a processing position and a lower, substrate-loading position. The motor, the gas mixing system 119, and the RF power supply 125 are controlled by a system controller 134 over control lines 136. The reactor includes analog assemblies, such as mass flow controllers (MFCs) and standard or pulsed RF generators, that are controlled by the system controller 134 which executes system control software stored in a memory 138, which in the preferred embodiment is a hard disk drive. Motors and optical sensors are used to move and determine the position of movable mechanical assemblies such as the throttle valve of the vacuum pump 132 and motor for positioning the susceptor 112.

The system controller 134 controls all of the activities of the CVD reactor and a preferred embodiment of the controller 134 includes a hard disk drive, a floppy disk drive, and a card rack. The card rack contains a single board computer (SBC), analog and digital input/output boards, interface boards and stepper motor controller boards. The system controller conforms to the Versa Modular Europeans (VME) standard which defines board, card cage, and connector dimensions and types. The VME standard also defines the bus structure having a 16-bit data bus and 24-bit address bus.

Figure 3:
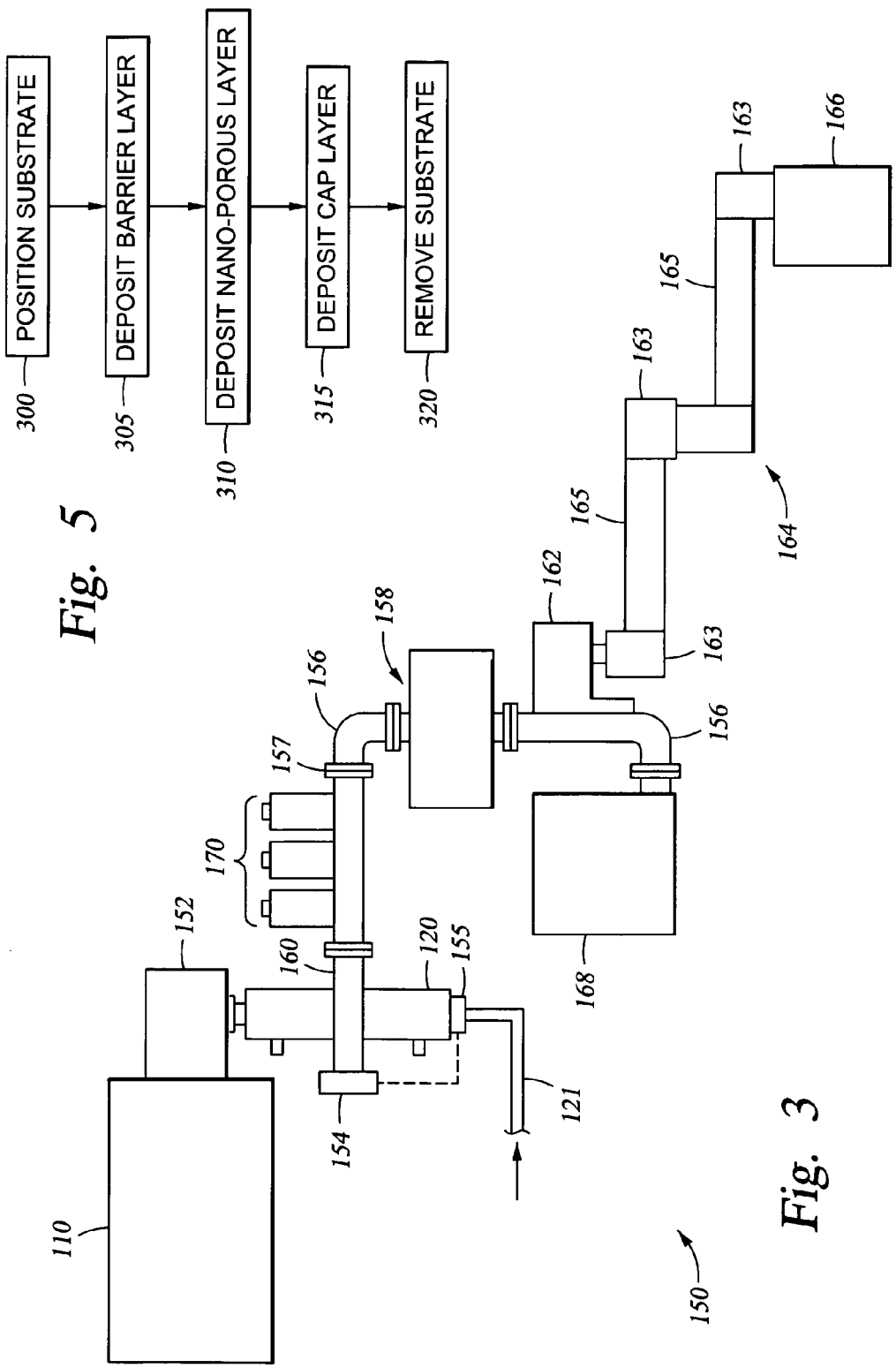
FIG. 3 is a schematic diagram of a remote microwave chamber for dissociation of process gases prior to entering the reactor of FIG. 2.

FIG. 3 is a simplified diagram of a remote microwave system 150 for dissociating process gases such as water prior to entering the DLK reactor 110, in accordance with an embodiment of the present invention. Remote microwave system 150 includes an applicator tube 120, a plasma ignition system including an ultraviolet (UV) lamp 154 and a UV power supply 155, a microwave waveguide system that includes various lengths of straight and curved waveguide sections 156, waveguide coupling 158, which may be connected together at joints 157, an output waveguide section 160, and a magnetron 168. The waveguide section 156 may further have an arm support 162 formed therein for attachment to a pivoting arm 164 mounted on a arm base 166. The pivoting arm comprises arm pieces 165 coupled to arm joints 163 that provide vertical separation of the arm pieces and allow rotational movement of the arm 164 around the arm joints 163. The arm joints 163, are vertically disposed cylinders coupled to one arm piece 165 at the bottom of the arm joint 163 and coupled to a second arm piece 165 at the top of the arm joint 165. The attachment of the arm pieces 165 at the ends of the arm joint 163 allow for vertical separation of the arm pieces and flexibility of position the arm 164, and thus the microwave system 150, during operation and maintenance of the processing reactor 110.

Magnetron 168 is a typical magnetron source capable of operating between about 0–3000 Watts for continuous wave (CW) or pulsed output of microwaves of about 2.45 Gigahertz (GHz) frequency. Of course, other magnetrons may be utilized as well. Circulator (not shown) allows only forward microwave transmission from magnetron 168 toward applicator tube 120. Tuning system 170, which may use stub tuners or other tuning elements, provides the microwave system 150 with the ability to match the load at waveguide section 160 to the characteristic impedance of the waveguides. Tuning system 170 may provide fixed tuning, manual tuning, or automated tuning, according to specific embodiments. In the specific embodiment, the waveguide sections have rectangular cross-sections, but other types of waveguide also may be used.

Applicator tube 120 is a circular (or other cross-section) tube made of a composite or ceramic material, preferably alumina, or other material resistant to etching by radicals. In a specific embodiment, applicator tube 120 has a length of about 18–24 inches and a cross-sectional diameter of about 3–4 inches. Applicator tube 120 is disposed through a waveguide section 160, which is open at one end for transmitting microwaves and is terminated at the other end with a metal wall. Microwaves are transmitted through the open end of waveguide section 160 to gases inside applicator tube 120, which is transparent to microwaves. Of course, other materials such as sapphire also may be used for the interior of applicator tube 120. In other embodiments, applicator tube 120 may have a metal exterior and an interior made of a composite or ceramic material wherein microwaves in waveguide section 160 enter a window through the exterior of applicator tube 120 to the exposed interior of tube 120 to energize the gases.

Figure 4:
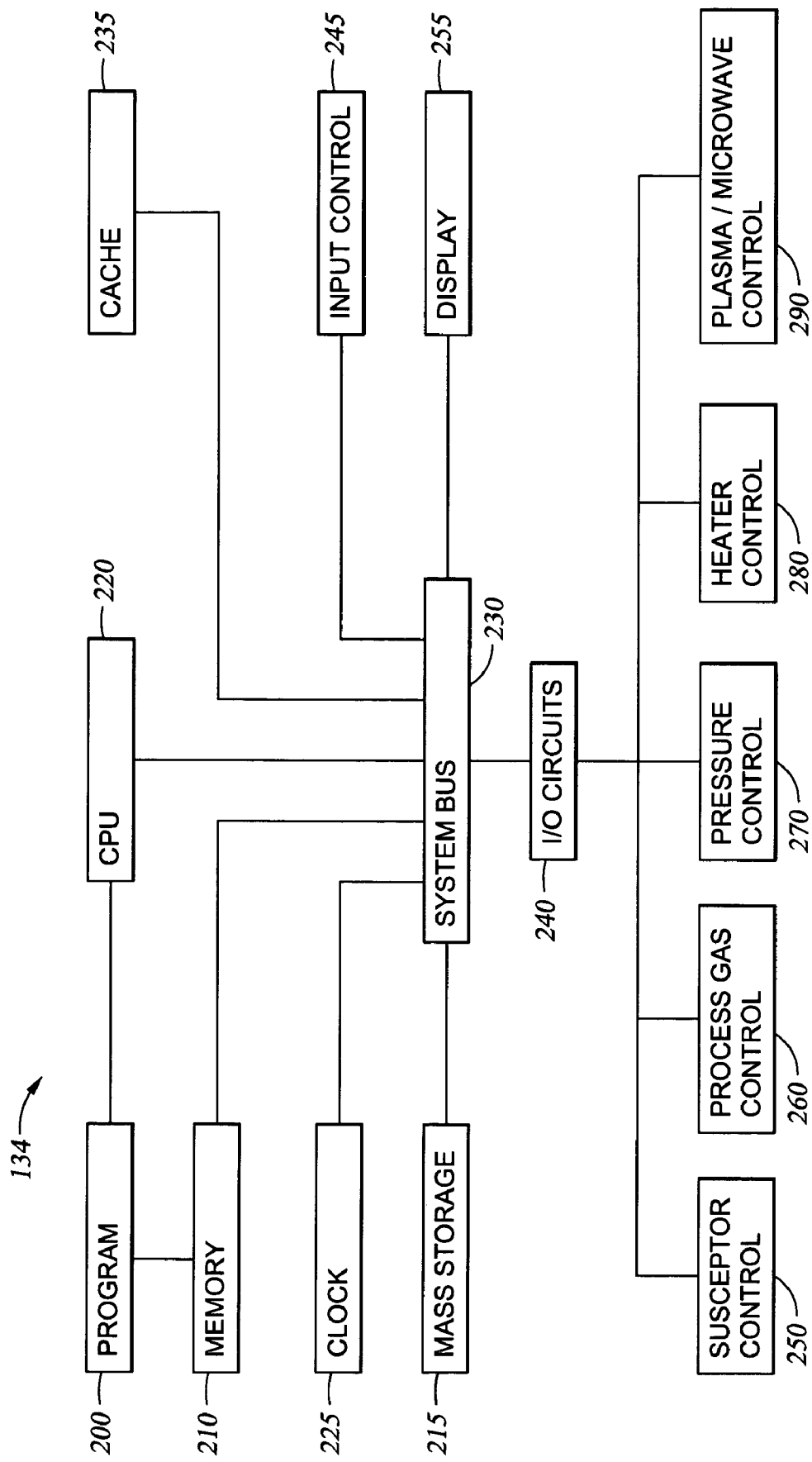
FIG. 4 is a flowchart of a process control computer program product used in conjunction with the exemplary CVD reactor of FIG. 2.

The above-described method can be implemented in a system that is controlled by a processor based system controller such as the controller 134 shown in FIG. 2. FIG. 4 shows a block diagram of a processing system, or reactor 110, such as that depicted in FIG. 2, having such a system controller 134 that can be employed in such a capacity. The system controller 134 includes a programmable central processing unit (CPU) 220 that is operable with a memory 210, a mass storage device 215, an input control unit 245, and a display unit 255. The system controller further includes well-known support circuits such as power supplies, clocks 225, cache 235, input/output (I/O) circuits 240 and the like, coupled to the various components of the DLK process reactor 110 to facilitate control of the deposition process. The controller 134 also includes hardware for monitoring substrate processing through sensors (not shown) in the chamber 110. Such sensors measure system parameters such as substrate temperature, chamber atmosphere pressure and the like. All of the above elements are coupled to a control system bus 230.

To facilitate control of the chamber as described above, the CPU 220 may be one of any form of general purpose computer processor that can be used in an industrial setting for controlling various chambers and subprocessors. The memory 210 is coupled to the CPU 220, and is accessible to the system bus 230. The memory 210, or computer-readable medium 215, may be one or more of readily available memory such as random access memory (RAM), read only memory (ROM), floppy disk drive, hard disk, or any other form of digital storage, local or remote. The support circuits are coupled to the CPU 220 for supporting the processor in a conventional manner. The deposition process is generally stored in the memory 210, typically as a software routine. The software routine may also be stored and/or executed by a second CPU (not shown) that is remotely located from the hardware being controlled by the CPU 220.

The memory 210 contains instructions that the CPU 220 executes to facilitate the performance of the reactor 110. The instructions in the memory 210 are in the form of program code such as a program 200 that implements the method of the present invention. The program code may conform to any one of a number of different programming languages. For example, the program code can be written in C, C++, BASIC, Pascal, or a number of other languages.

The mass storage device 215 stores data and instructions and retrieves data and program code instructions from a processor readable storage medium, such as a magnetic disk or magnetic tape. For example, the mass storage device 215 can be a hard disk drive, floppy disk drive, tape drive, or optical disk drive. The mass storage device 215 stores and retrieves the instructions in response to directions that it receives from the CPU 220. Data and program code instructions that are stored and retrieved by the mass storage device 215 are employed by the processor unit 220 for operating the processing system. The data and program code instructions are first retrieved by the mass storage device 215 from a medium and then transferred to the memory 210 for use by the CPU 220.

The input control unit 245 couples a data input device, such as a keyboard, mouse, or light pen, to the processor unit 220 via the system bus 230 to provide for the receipt of a chamber operator's inputs. The display unit 255 provides information to a chamber operator in the form of graphical displays and alphanumeric characters under control of the CPU 220.

The control system bus 230 provides for the transfer of data and control signals between all of the devices that are coupled to the control system bus 230. Although the control system bus is displayed as a single bus that directly connects the devices in the CPU 220, the control system bus 230 can also be a collection of busses. For example, the display unit 255, input control unit 245 (with input device), and mass storage device 215 can be coupled to an input-output peripheral bus, while the CPU 220 and memory 210 are coupled to a local processor bus. The local processor bus and input-output peripheral bus are coupled together to form the control system bus 230.

The system controller 134 is coupled to the elements of the reactor 110, employed in dielectric deposition processes in accordance with the present invention via the system bus 230 and the I/O circuits 240. The I/O circuits 240 receive instructions from the program 200 stored in memory 210 via the CPU 220 and system bus 230. The program 200 provides program subroutines that enable the I/O circuits 240 to provide for susceptor positioning control 250, process gas control 260, pressure control 270, heater control 280, and plasma/microwave control 290, of the reactor 110.

The CPU 220 forms a general purpose computer that becomes a specific purpose computer when executing programs such as the program 200 of the embodiment of the method of the present invention depicted in the flow diagram of FIG. 4. Although the invention is described herein as being implemented in software and executed upon a general-purpose computer, those skilled in the art will realize that the invention could be implemented using hardware such as an application specific integrated circuit (ASIC) or other hardware circuitry. As such, it should be understood that the invention can be implemented, in whole or in part, in software, hardware or both.

The above CVD system description is mainly for illustrative purposes, and other plasma CVD equipment such as electrode cyclotron resonance (ECR) plasma CVD devices, induction-coupled RF high density plasma CVD devices, or the like may be employed. Additionally, variations of the above described system such as variations in susceptor design, heater design, location of RF power connections and others are possible. For example, the substrate could be supported and heated by a resistively heated susceptor. The pretreatment and method for forming a pretreated layer of the present invention is not limited to any specific apparatus or to any specific plasma excitation method.

Deposition of a Nano-Porous Silicon Oxide Layer

The nano-porous silicon oxide layer of the present invention can be deposited in a three-layer process as shown in FIG. 5 using the PECVD or microwave chamber of FIG. 2. Referring to FIG. 5, a substrate is positioned 300 in the reactor 110 and a barrier layer is deposited 305 by a PECVD process from a plasma comprising a reactive silicon containing compound. The deposition step 305 can include a capacitively coupled plasma or both an inductively and a capacitively coupled plasma in the process chamber according to methods known in the art. An inert gas such as helium is commonly used in the PECVD deposition to assist in plasma generation. A nano-porous layer of the present invention is then deposited 310 on the barrier layer by depositing a silicon/oxygen containing material that further contains labile organic groups, and by controlled annealing of the deposited silicon/oxygen containing material to form microscopic gas pockets that are uniformly dispersed in the layer. Next, a cap layer is then deposited 315 on the layer, preferably using a similar process as employed for depositing the barrier layer. The substrate is then removed 320 from the reactor 110.

Referring to FIGS. 6A–6E, the three-layer process provides a PECVD lining layer 400. The lining layer 400 acts as an isolation layer between the subsequent nano-porous layer 402 and the underlying substrate surface 404 and metal lines 406, 408, 410 formed on the substrate surface. The nano-porous layer 402 is capped by a PECVD capping layer 412 of the silicon containing compound. This process is implemented and controlled using a computer program stored in the memory 210 of a computer controller 134 for a CVD reactor 110.

Figure 6A:
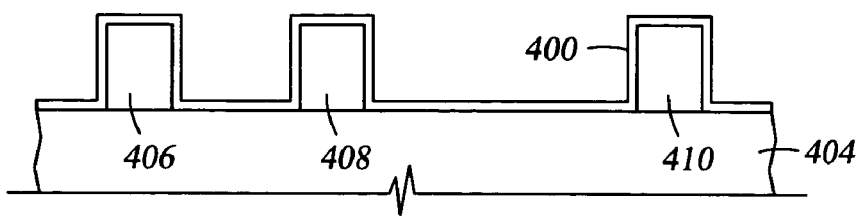
FIG. 6A-6E is a schematic diagram of the layers deposited on a substrate by the process of FIG. 5.

Referring to FIG. 6A, the PECVD lining layer 400 is deposited in the reactor 110 by introducing a reactive silicon containing compound and an oxidizing gas. The process gases react in a plasma enhanced environment to form a conformal silicon oxide layer 400 on the substrate surface 404 and metal lines 406, 408, 410.

Figure 6B:
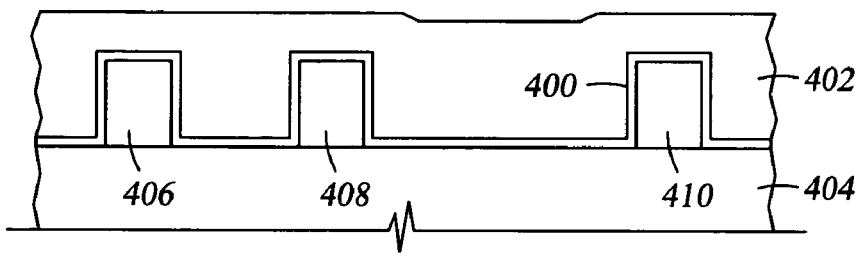
Figure 6C:
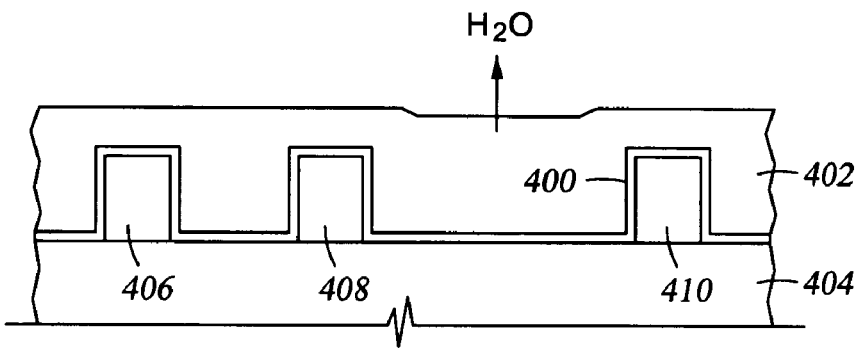
Figure 6D:
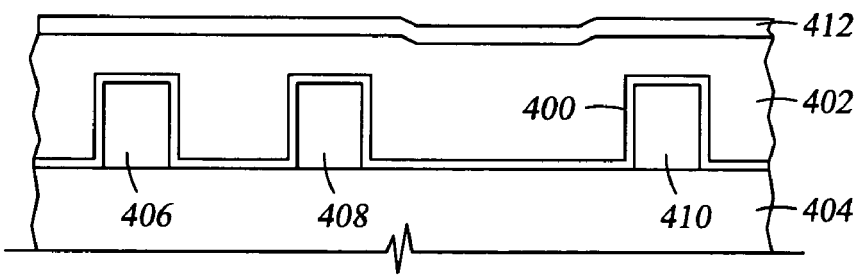

Referring to FIG. 6B, the nano-porous layer 402 is deposited from a processing gas consisting of silicon and labile containing compounds and an oxidizing gas. The process gas flows range from about 20 to about 1000 sccm for the silicon and labile containing compounds, and about 5 to about 4000 sccm of the oxidizing gas. The preferred gas flows range from about 50 to about 500 sccm for the silicon and labile containing compounds and a flow rate of about 5 to about 2000 sccm of the oxidizing gas. These flow rates are given for a chamber having a volume of approximately 5.5 to 6.5 liters. Preferably, reactor 110 is maintained at a pressure of about 0.2 to about 5 Torr during deposition of the nano-porous layer 402. The nano-porous layer 402 is cured as shown in FIG. 6C to remove volatile constituents prior to deposition of a cap layer 412 as shown in FIG. 6D. Curing can be performed in the reactor 110 under an inert gas atmosphere while heating the substrate to progressively higher temperatures.

The nano-porous layer 402 is preferably annealed at a gradually increasing temperature to retain gaseous products as dispersed microscopic bubbles, and/or to convert the optional labile organic groups to dispersed microscopic gas bubbles that are retained in the cured silicon oxide film as voids in a preferably closed cell structure. A preferred anneal process comprises a heating time period of about 5 minutes, including gradually raising the temperature by about 50° C./min. to a final temperature of between about 350° C. to about 400° C. Dispersion of the gas bubbles can be controlled by varying the temperature/time profile and by controlling the concentration of labile organic groups in the deposited film.

Figure 6E:
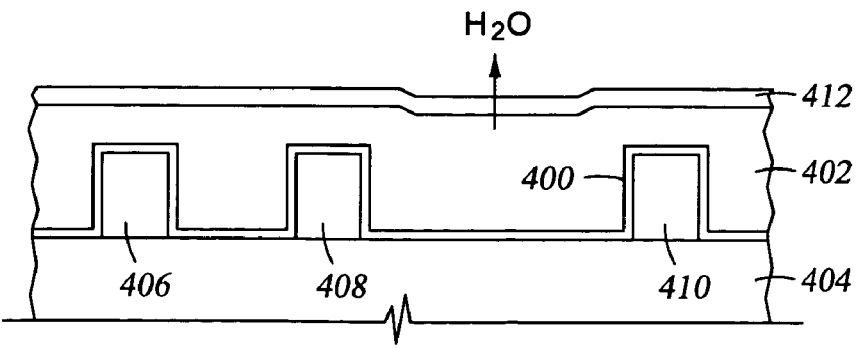

Referring to FIG. 6D, the reactor 110 deposits a capping layer 412, preferably of the same material and by the same methods as used for the deposition of the PECVD liner layer 400. Referring to FIG. 6E, after deposition of the capping layer 412, the deposited layers are further annealed in a furnace or another chamber at a temperature from about 200° C. to about 450° C. to drive off remaining volatile products such as water. Of course, processing conditions will vary according to the desired characteristics of the deposited films.

Deposition of a Dual Damascene Structure

Figure 7:
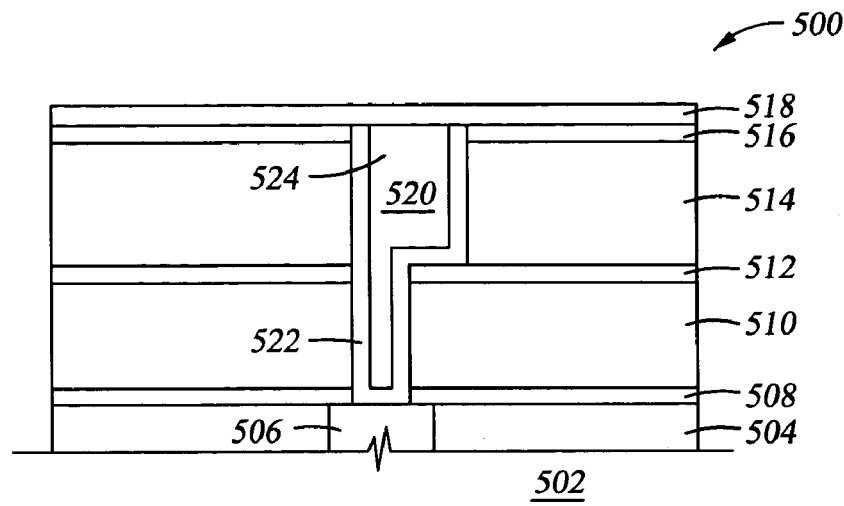
FIG. 7 is a cross sectional view showing a dual damascene structure comprising the silicon oxide layers of the present invention.

A preferred dual damascene structure 500 fabricated in accordance with the invention is shown in FIG. 7, and the method of making the structure is sequentially depicted schematically in FIGS. 8A–8H, which are cross sectional views of a substrate having the steps of the invention formed thereon.

A dual damascene structure 500 which includes a nanoporous intermetal dielectric layer 510 is shown in FIG. 7. The intermetal dielectric layers 510 and 514 deposited according to the invention have extremely low dielectric constants of less than 3, and are often referred to as extreme low k, or ELk, dielectric layers. A first dielectric layer 510, preferably consisting of the nano-porous silicon oxide layer of the present invention is deposited on a substrate 502. The substrate comprising patterned conducting lines 506 formed in a contact level substrate material 504, with a first (or substrate) etch stop 508 of silicon oxide, silicon nitride, silicon oxynitride, or amorphous hydrogenated silicon carbide (BLOk™), preferably silicon nitride, deposited thereon.

A silicon oxide, silicon nitride, silicon oxynitride, or hydrogenated silicon carbide (BLOk™) second etch stop 512 is deposited on the first dielectric layer 510. A second dielectric layer 514, preferably consisting of the nano-porous silicon oxide layer of the present invention is deposited on the second etch stop 512, with a third etch stop 516 deposited on the second dielectric layer 514. The deposited layers are etched to form a via 520, which is subsequently filled with a conducting metal 524, preferably copper, over a barrier layer 522 conformally deposited within the via 520. The structure is then planarized and a capping layer 518 comprising silicon nitride, silicon oxide, silicon oxynitride, or hydrogenated silicon carbide, preferably comprising silicon nitride, is deposited thereon. The capping layer 518 also serves as the substrate etch stop and corresponds to the first etch stop 508 for subsequent dual damascene multilevel interconnects.

Figure 8A:
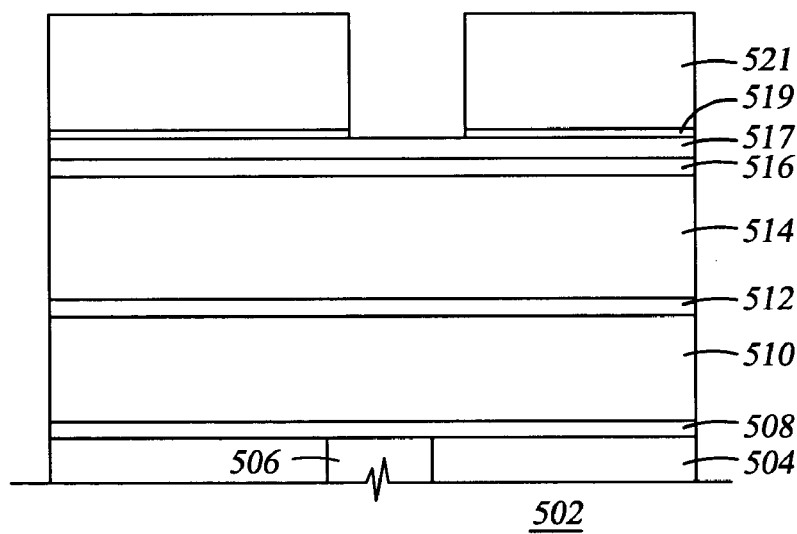
FIGS. 8A–8H are cross sectional views showing one embodiment of a dual damascene deposition sequence of the present invention.

As shown in FIG. 8A, a first (or substrate) etch stop 508 of silicon oxide, silicon nitride, silicon oxynitride, or amorphous hydrogenated silicon carbide, preferably silicon nitride is deposited to a thickness of about 1000 Å on the substrate 502. The substrate 502 comprises patterned conducting interconnects or lines 506 formed in a contact level substrate material 504. A first nano-porous dielectric layer 510 is deposited according to the invention on the first etch stop 508. The first dielectric layer 510 has a thickness of about 5,000 Å to about 10,000 Å, depending on the size of the structure to be fabricated, but has a preferable thickness of about 5,000 Å. The first dielectric layer 510 and is then annealed at a temperature of about 350° C. to about 400° C. to remove volatile contaminants from the layer 510. A second etch stop 512, such as silicon oxynitride, is deposited on the dielectric layer 510 to a thickness of about 500 Å. A second nano-porous dielectric layer 514 is then deposited a thickness of about 5,000 Å to about 10,000 Å, preferably about 5,000 Å, according to the invention on the first etch stop 508, and is then annealed at a temperature of about 350° C. to about 400° C.

A third etch stop 516 of silicon oxide, silicon nitride, silicon oxynitride, or amorphous hydrogenated silicon carbide (BLOk™), preferably silicon nitride is deposited on the second dielectric layer 514 to a thickness of about 500 Å to about 1000 Å, preferably at about 1000 Å. A silicon oxide layer 517 having a thickness of about 2000 Å is then deposited on the third etch stop 516 to serve both as a hard etch mask as well as for future use in a chemical mechanical polishing (CMP) step. An anti-reflective coating (ARC) 519 and a trench photomask comprising a photoresist layer 521 are then respectively deposited over the silicon oxide layer 517. The photoresist layer 521 is then patterned by conventional photolithography means known in the art.

Figure 8B:
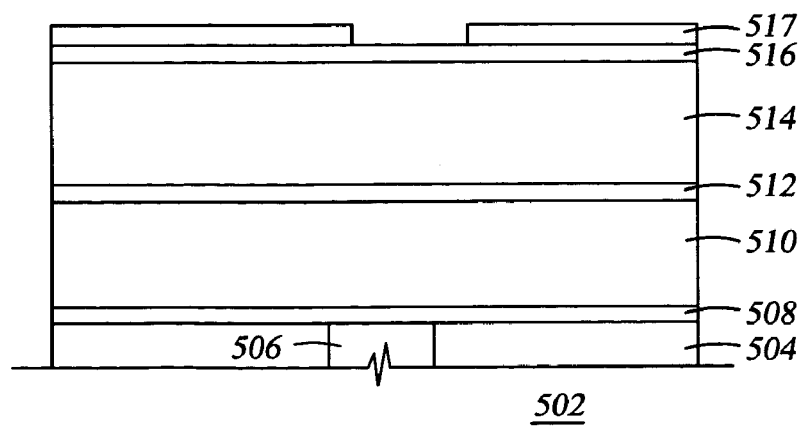
Figure 8C:
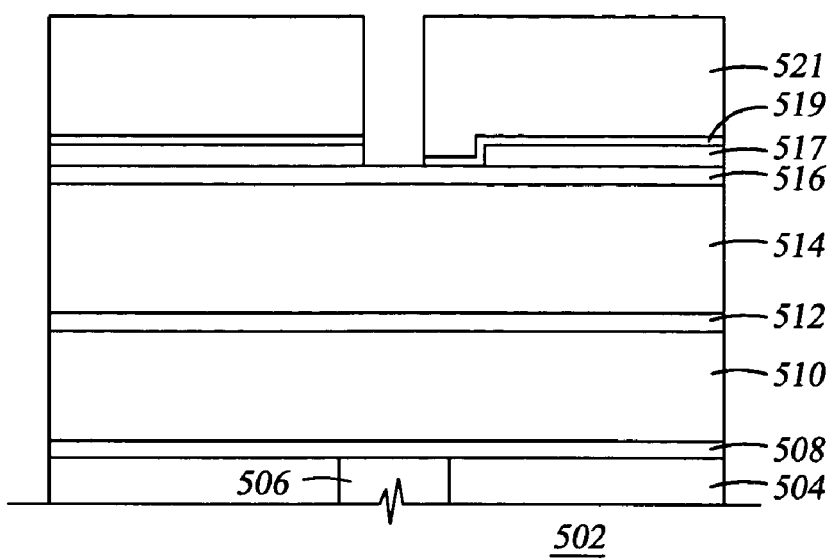

The silicon oxide layer 517 is then etched by conventional means known in the art, preferably by an etch process using fluorocarbon chemistry, to expose the third etch stop 516 as shown in FIG. 8B. The initial etch of the silicon oxide layer 517 establishes the opening width, or trench width, of the dual damascene structure 500. The opening width formed in the silicon oxide layer 517 defines the horizontal interconnect of the dual damascene structure 500 formed above the second etch stop 514. The remaining photoresist 521 is then ashed, or dry removed, for preparation of the via etch. For formation of the contact or via width of the dual damascene structure, a second anti-reflective coating 519 and a photoresist layer 521 are then respectivly deposited over the thin silicon oxide layer 517, and then patterned by photolithography to expose the third etch layer 516 by the via width as shown in FIG. 8C.

Figure 8D:
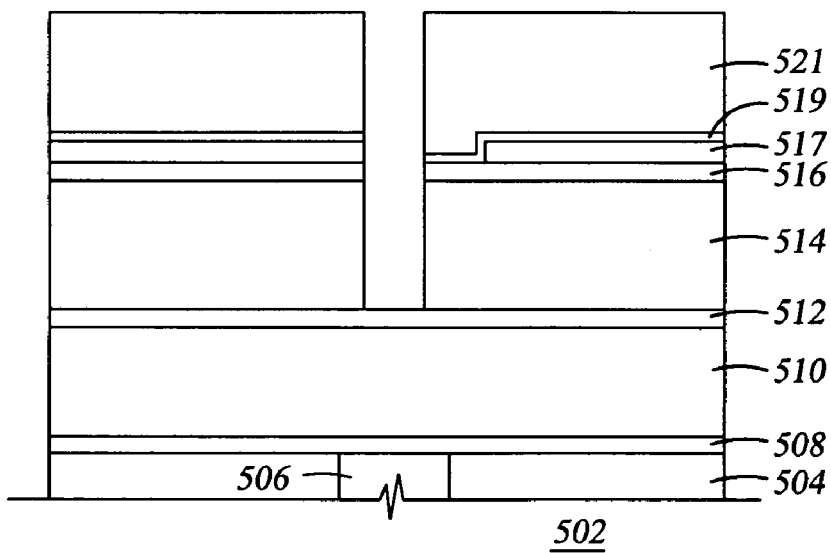
Figure 8E:
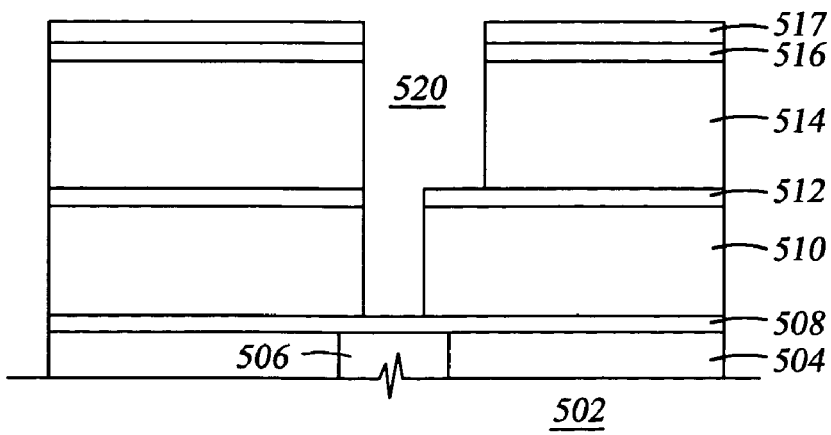
Figure 8F:
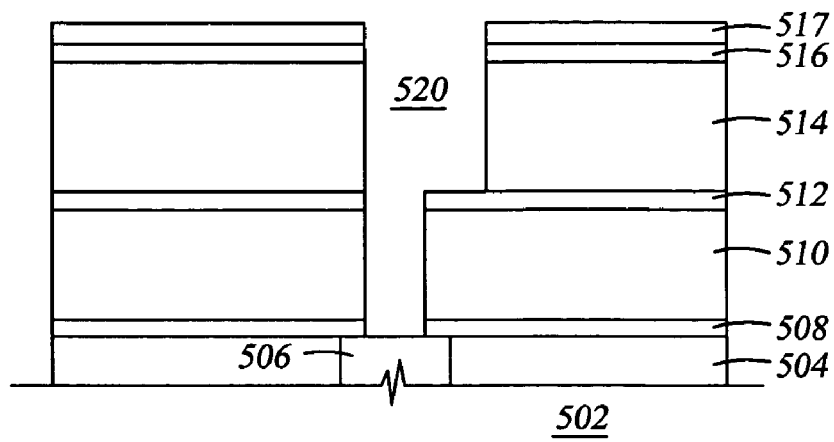

Referring to FIG. 8D, the third etch stop 516 and second dielectric layer 514, are trench etched to expose the second etch stop 512. The via 520 is then formed by via etching the second dielectric layer 514 to the second etch stop 512 using anisotropic etching techniques to define the metallization structure (i.e., the interconnect and contact/via) at the width established by the silicon oxide layer 517; and etching the first dielectric layer 510 to the first etch stop 508 at the via width established during the etching of the third etch stop 516, second dielectric layer 514, and the second etch stop 512 as shown in FIG. 8E. Any photoresist or ARC material used to pattern the second etch stop 512 or the second dielectric layer 514 is removed using an oxygen strip or other suitable process. FIG. 8F shows the etching of the first etch stop 508 protecting the substrate 502, exposing the underlying patterned metal lines 506 in the contact level substrate material 504. The patterned metal lines 506 preferably comprise a conducting metal such as copper. The dual damascene structure 500 is then precleaned by conventional means known in the art prior to subsequent layer deposition.

Figure 8G:
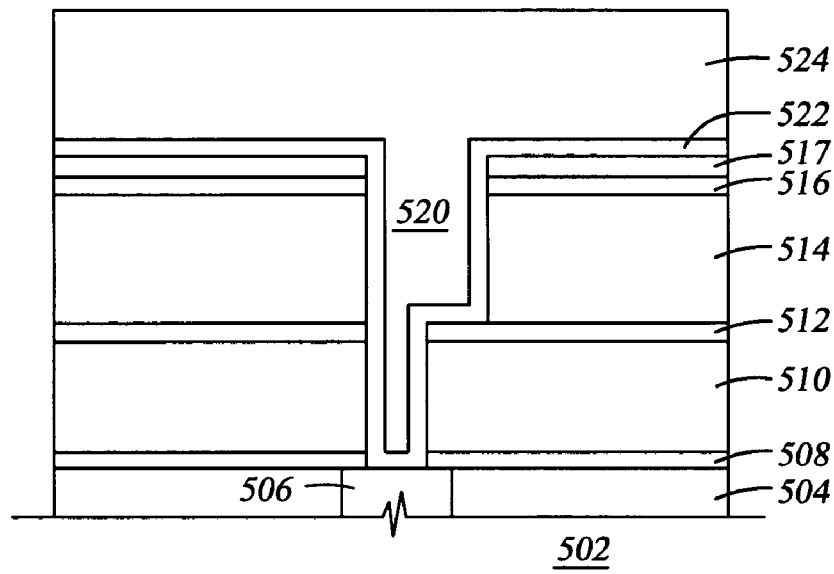
Figure 8H:
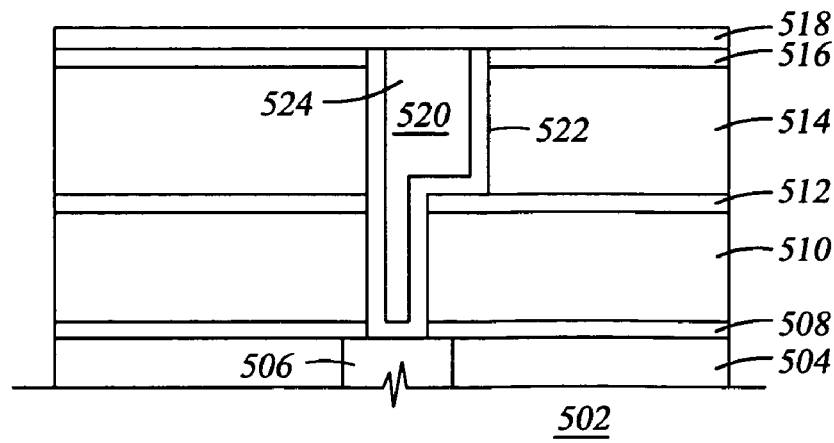

The metallization structure is then formed with a conductive material such as aluminum, copper, tungsten or combinations thereof. Presently, the trend is to use copper to form the smaller features due to the low resistivity of copper (1.7 $\mu\Omega$-cm compared to 3.1 $\mu\Omega$-cm for aluminum). Preferably, as shown in FIG. 8G, a suitable barrier layer 522 such as tantalum nitride is first deposited conformally in the metallization pattern 520 to prevent copper migration into the surrounding silicon and/or dielectric material. Thereafter, a layer of copper 524 is deposited using either chemical vapor deposition, physical vapor deposition, electroplating, preferably by electroplating, to form the conductive structure. Once the structure has been filled with copper or other metal, the surface is planarized using chemical mechanical polishing and capped with a capping layer 518, preferably comprising silicon nitride and having a thickness of about 1000 Å, as shown in FIG. 8H. Prior to planarizing the surface, the metal may be annealed in a hydrogen atmosphere to recrystallize the copper fill and to remove voids that may have formed in the structure 500. While not shown, a copper seed layer may be deposited prior to the copper layer 524 when the copper layer 524 is deposited by an electroplating process. The dual damascene formation process may then be repeated to deposit further interconnection levels, of which modern microprocessor integrated circuits have 5 or 6 interconnection levels.

EXAMPLES

The following examples demonstrate deposition of a nano-porous silicon oxide based film having dispersed microscopic gas voids. This example is undertaken using a chemical vapor deposition chamber, and in particular, a CENTURA "DLK" system fabricated and sold by Applied Materials, Inc., Santa Clara, Calif.

Silicon Compound having Silicon Containing and Thermally Labile Imparting Components (Hypothetical)

A nano-porous silicon oxide based film is deposited at a chamber pressure of 1.0 Torr and temperature of 30° C. from reactive gases which are vaporized and flown into the reactor as follows:

| | |
|---|---|
| methylsilyl-2-furyl ether, at | 150 sccm |
| nitrous oxide ($N_2O$), at | 1000 sccm |

Prior to entering the chamber, the nitrous oxide is dissociated in a microwave applicator that provides 2000 W of microwave energy. The substrate is positioned 600 mil from the gas distribution showerhead and the reactive gases are introduced for 2 minutes. The substrate is then heated over a time period of 5 minutes, raising the temperature of the substrate by 50° C./min to a temperature of 400° C. to cure and anneal the nano-porous silicon oxide based film.

Mixture of Silicon Containing Compound and Added Thermally Labile Imparting Compound (Hypothetical)

A nano-porous silicon oxide based film is deposited at a chamber pressure of 1.0 Torr and temperature of 30° C. from reactive gases which are vaporized and flown into the reactor as follows:

| | |
|---|---|
| cyclo-1,3,5,7-tetrasilylene-2,6-dioxy-4,8 dimethylene, at | 100 sccm |
| vinyl-2-furyl ether, at | 50 sccm |
| Nitrous Oxide ($N_2O$), at | 1000 sccm |

Prior to entering the chamber, the nitrous oxide is dissociated in a microwave applicator that provides 2000 W of microwave energy. The substrate is positioned 600 mil from the gas distribution showerhead and the reactive gases are introduced for 2 minutes. The substrate is then heated over a time period of 5 minutes, raising the temperature of the substrate by 50° C./min to a temperature of 400° C. to cure and anneal the nano-porous silicon oxide based film.

Silicon Compound having Silicon Containing and Thermally Labile Imparting Components and Added Silicon Containing Compound (Hypothetical)

A nano-porous silicon oxide based film is deposited at a chamber pressure of 1.0 Torr and temperature of 0° C. from reactive gases which are vaporized and flown into the reactor as follows:

| | |
|---|---|
| methylsilyl-2-furyl ether, at | 100 sccm |
| cyclo-1,3,5,7-tetrasilylene-2,6-dioxy-4,8 dimethylene, at | 50 sccm |
| Nitrous Oxide ($N_2O$), at | 1000 sccm. |

Prior to entering the chamber, the nitrous oxide is dissociated in a microwave applicator that provides 2000 W of microwave energy. The substrate is positioned 600 mil from the gas distribution showerhead and the reactive gases are introduced for 2 minutes. The substrate is then heated over a time period of 5 minutes, raising the temperature of the substrate by 50° C./min to a temperature of 400° C. to cure and anneal the nano-porous silicon oxide based film.

While the foregoing is directed to the preferred embodiment of the present invention, other and further embodiments of the invention may be devised without departing from the basic scope thereof. The scope of the invention is determined by the claims which follow.

What is claimed is:

1. A method for depositing a nano-porous dielectric layer, comprising:
    reacting an organosilane or organosiloxane with a compound comprising the structure C—O—C within a cyclic ring and with a gas selected from the group consisting of $N_2O$, $O_2$, $O_3$, $CO_2$, and combinations thereof to deposit a dielectric layer comprising silicon, oxygen, and carbon; and
    annealing the dielectric layer to form the nano-porous dielectric layer.

2. The method of claim 1, wherein the compound comprising the structure C—O—C within a cyclic ring is a non-silicon containing compound.

3. The method of claim 2, wherein the non-silicon containing compound is selected from the group consisting of vinyl-1,4-dioxin, furyl formate, furan, and 1,4-dioxin.

4. The method of claim 1, wherein the compound comprising the structure C—O—C within a cyclic ring is furan.

5. The method of claim 1, wherein the compound comprising the structure C—O—C within a cyclic ring is 1,4-dioxin.

6. The method of claim 1, wherein the organosilane or organosiloxane is an organosiloxane.

7. A method for depositing a nano-porous dielectric layer, comprising:
    reacting an organosilane or organosiloxane with a compound comprising the structure C—O—C within a cyclic ring and silicon to deposit a dielectric layer comprising silicon, oxygen, and carbon; and
    annealing the dielectric layer to form the nano-porous dielectric layer.

8. The method of claim 7, wherein the compound comprising the structure C—O—C within a cyclic ring is selected from the group consisting of methylsilyl-1,4-dioxinyl ether, 2-methylsiloxanyl furan, 3-methylsiloxanyl furan, 2,5-bis(methylsiloxy)-1,4-dioxin, 3,4-bis(methylsiloxanyl) furan, 2,3-bis(methylsiloxanyl) furan, 2,4-bis(methylsiloxanyl) furan, 2,5-bis(methylsiloxanyl) furan, dimethylsilyl-1,4-dioxinyl ether, 2-dimethylsiloxanyl furan, 3-dimethylsiloxanyl furan, 2,5-bis(dimethylsiloxy)-1,4-dioxin, 3,4-bis(dimethylsiloxanyl) furan, 2,3-bis(dimethylsiloxanyl) furan, 2,4-bis(dimethylsiloxanyl) furan, and 2,5-bis(dimethylsiloxanyl) furan.

9. A method for depositing a nano-porous dielectric layer, comprising:
    reacting an organosilane or organosiloxane with a compound comprising the structure C—O—C within a cyclic ring and a carbon-oxygen double bond and with a gas selected from the group consisting of $N_2O$, $O_2$, $O_3$, $CO_2$, and combinations thereof to deposit a dielectric layer comprising silicon, oxygen, and carbon; and
    annealing the dielectric layer to form the nano-porous dielectric layer.

10. The method of claim 9, wherein the compound comprising the structure C—O—C within a cyclic ring and a carbon-oxygen double bond is a non-silicon containing compound.

11. The method of claim 10, wherein the non-silicon containing compound is selected from the group consisting of methyl furoate, furyl formate, furyl acetate, furaldehyde, and difuryl ketone.

12. The method of claim 9, wherein the organosilane or organosiloxane is an organosiloxane.

13. The method of claim 12, wherein the compound comprising the structure C—O—C within a cyclic ring and a carbon-carbon double bond is furyl formate.

14. A method for depositing a nano-porous dielectric layer, comprising:
    reacting an organosilane or organosiloxane with a compound comprising the structure C—O—C within a cyclic ring and a carbon-carbon double bond and with a gas selected from the group consisting of $N_2O$, $O_2$, $)_3$, $CO_2$, and combinations thereof to deposit a dielectric layer comprising silicon, oxygen, and carbon; and
    annealing the dielectric layer to form the nano-porous dielectric layer.

15. The method of claim 14, wherein the compound comprising the structure C—O—C within a cyclic ring and a carbon-carbon double bond is a non-silicon containing compound.

16. The method of claim 15, wherein the non-silicon containing compound is selected from the group consisting of vinyl-1,4-dioxin, methyl furoate, furyl formate, furyl acetate, furaldehyde, difuryl ketone, furan, and 1,4-dioxin.

17. The method of claim 14, wherein the compound comprising the structure C—O—C within a cyclic ring and a carbon-carbon double bond is furan.

18. The method of claim 14, wherein the compound comprising the structure C—O—C within a cyclic ring and a carbon-carbon double bond is 1,4-dioxin.

19. The method of claim 14, wherein the organosilane or organosiloxane is an organosiloxane.

20. The method of claim 14, wherein the organosilane or organosiloxane is a linear organosiloxane.

* * * * *

UNITED STATES PATENT AND TRADEMARK OFFICE
CERTIFICATE OF CORRECTION

PATENT NO.       : 7,012,030 B2                                    Page 1 of 1
APPLICATION NO.  : 10/882780
DATED            : March 14, 2006
INVENTOR(S)      : Robert P. Mandal It is certified that error appears in the above-identified patent and that said Letters Patent is hereby corrected as shown below:

<u>On the Title Page</u>

Item 57 (Abstract), Line 5: Change "liable" to --labile--

<u>In the Specification</u>

Column 2, Line 14: Before "carbon", change "an" to --a--

Column 11, Line 1: Before "applicator", change "a" to --an--

Column 11, Line 6: Change "18" to --118--

Column 16, Line 50: Delete the "and" after "510"

Column 17, Line 18: Change "respectivly" to --respectively--

<u>In the Claims</u>

Column 20, Claim 14, Line 30: Change ")$^3$" to --O$^3$--

Signed and Sealed this

Fifth Day of September, 2006

JON W. DUDAS
*Director of the United States Patent and Trademark Office*